United States Patent
Wang

(10) Patent No.: US 9,461,194 B2
(45) Date of Patent: Oct. 4, 2016

(54) METHOD FOR FABRICATING P-TYPE SEMICONDUCTOR SUBSTRATE, SOLAR CELL AND METHOD FOR FABRICATING THE SAME

(71) Applicant: GAMC Biotech Development Co., LTD., New Taipei (TW)

(72) Inventor: Chia-Gee Wang, New York, NY (US)

(73) Assignee: Chia-Gee Wang, New York, NY (US)

( * ) Notice: Subject to any disclaimer, the term of this patent is extended or adjusted under 35 U.S.C. 154(b) by 816 days.

(21) Appl. No.: 13/653,420

(22) Filed: Oct. 17, 2012

(65) Prior Publication Data

US 2013/0125972 A1 May 23, 2013

Related U.S. Application Data

(60) Provisional application No. 61/607,011, filed on Mar. 6, 2012, provisional application No. 61/547,868, filed on Oct. 17, 2011.

(30) Foreign Application Priority Data

Oct. 9, 2012 (TW) .............................. 101137327 A

(51) Int. Cl.
*H01L 21/20* (2006.01)
*H01L 31/18* (2006.01)
*H01L 21/02* (2006.01)
*H01L 31/0368* (2006.01)
*H01L 31/074* (2012.01)
*H01L 31/0747* (2012.01)

(52) U.S. Cl.
CPC ..... *H01L 31/1864* (2013.01); *H01L 21/02389* (2013.01); *H01L 21/02392* (2013.01); *H01L 21/02395* (2013.01); *H01L 21/02532* (2013.01); *H01L 21/02579* (2013.01); *H01L 21/02601* (2013.01); *H01L 21/02628* (2013.01); *H01L 21/02694* (2013.01); *H01L 31/0368* (2013.01); *H01L 31/074* (2013.01); *H01L 31/0747* (2013.01); *H01L 31/182* (2013.01); *Y02E 10/546* (2013.01); *Y02P 70/521* (2015.11)

(58) Field of Classification Search
CPC ...................................................... H01L 21/20
See application file for complete search history.

(56) References Cited

U.S. PATENT DOCUMENTS

| | | | | |
|---|---|---|---|---|
| 2008/0295885 | A1* | 12/2008 | Lee .......................... | C30B 13/24 136/256 |
| 2011/0033630 | A1* | 2/2011 | Naik ....................... | C04B 41/52 427/452 |

* cited by examiner

Primary Examiner — Marvin Payen
(74) Attorney, Agent, or Firm — Jianq Chyun IP Office

(57) ABSTRACT

A method for fabricating a p-type semiconductor substrate including the following steps is provided. A carrier is provided, and the carrier includes a III-V compounds semiconductor layer and a III element layer disposed on the III-V compounds semiconductor layer. Si powders are disposed onto the III element layer of the carrier. The carrier is heated to enable the Si powders and the III element layer of the carrier to form a p-type poly-Si layer. In addition, a solar cell and a method of fabricating thereof are also provided.

25 Claims, 5 Drawing Sheets

METHOD FOR FABRICATING P-TYPE SEMICONDUCTOR SUBSTRATE, SOLAR CELL AND METHOD FOR FABRICATING THE SAME

CROSS-REFERENCE TO RELATED APPLICATION

This application claims the priority benefits of U.S. provisional application Ser. No. 61/547,868, filed on Oct. 17, 2011, U.S. provisional application Ser. No. 61/607,011, filed on Mar. 6, 2012, and Taiwan application serial no. 101137327, filed on Oct. 9, 2012. The entirety of each of the above-mentioned patent applications is hereby incorporated by reference herein and made a part of this specification.

BACKGROUND

1. Field of the Invention

The invention relates to a method for fabricating a semiconductor substrate, a battery and a method for fabricating the same. More particularly, the invention relates to a method for fabricating a p-type semiconductor substrate, a solar cell and a method for fabricating the same.

2. Description of Related Art

Energy supply of fossil fuels has become increasingly scarce, and the burning of fossil fuels brings environmental and air pollutions. Although nuclear power generation is able to supply a high power density, there are security concerns of nuclear radiation and nuclear waste storage. The former two both share a problem of increasing the social costs; and therefore, under considerations and needs of a cut expenditure and developments of clean/less polluting new energy and industrial technology, renewable energy has gradually come to attention, and various countries are all actively researching on the feasibility of using the renewable energy as an alternative energy.

In the renewable energy mentioned above, solar cell may convert sunlight into electricity, and thus solar energy has become one of the mainstreams in alternative energy. Solar cell technologies, as of today, may generally be divided as single crystal silicon solar cells, polycrystal silicon solar cells, amorphous silicon (a-Si) thin film solar cells, III-V solar cells and organic solar cells. In terms of the polycrystal silicon solar cells, fabrication steps thereof are tedious, such that these steps include acid etching, high temperature furnace pipe diffusion, plasma enhanced chemical vapor deposition, electrode screen printing and sintering. The fabrication process mentioned above requires spending a large number of equipments, energies and time costs, and thus a fabrication cost of this type of solar cell is unable to be significantly lowered. In more detail, the conventional polycrystal silicon solar cell includes a p-type semiconductor substrate. A fabrication cost of a polysilicon layer on the p-type semiconductor substrate is accounted for more than half of the fabrication cost of the entire polycrystal silicon solar cell. The main reason is that, nearly 90% of polysilicon materials are wasted during a process of slicing and grind polishing the p-type semiconductor substrate, and thus the cost of the conventional polycrystal silicon solar cell is unable to be significantly lowered.

SUMMARY OF THE INVENTION

The invention provides a method for fabricating a p-type semiconductor substrate capable of lowering a fabrication cost of the p-type semiconductor substrate.

The invention provides a method for fabricating a solar cell capable of lowering a fabrication cost of the solar cell.

The invention provides a method for fabricating a p-type semiconductor substrate including the following steps. A carrier is provided, and the carrier includes a III-V compounds semiconductor layer and a III element layer disposed on the III-V compounds semiconductor layer. Si powders are disposed onto the III element layer of the carrier. The carrier is heated to enable the Si powders and the III element layer of the carrier to form a p-type poly-Si layer.

The invention provides a method for fabricating a solar cell including the following steps. A carrier is provided, and the carrier includes a III-V compounds semiconductor layer and a III element layer disposed on the III-V compounds semiconductor layer. Si powders are disposed onto the III element layer of the carrier. The carrier is heated to enable the Si powders and the III element layer of the carrier to form a p-type poly-Si layer. An n-type semiconductor layer is formed on the p-type poly-Si layer.

The invention provides a solar cell including a carrier, a p-type poly-Si layer and an n-type semiconductor layer. The carrier includes a III-V compounds semiconductor layer. The p-type poly-Si layer is disposed on the III-V compounds semiconductor layer. The p-type poly-Si layer is disposed between the n-type semiconductor layer and the carrier.

In an embodiment of the invention, a method of providing the carrier includes the following steps. A III element substrate is provided. V element powders are disposed onto the III element substrate. The III element substrate is heated to combine a first portion of the III element substrate and the V element powders to form a III-V compounds layer, and a second portion of the III element substrate remains on the III-V compounds layer. The III element substrate is heated to a melting point of the III element, so that a portion of the second portion of the III element substrate and the III-V compounds layer form a III-V compounds semiconductor layer, wherein another portion of the second portion of the III element substrate is the III element layer.

In an embodiment of the invention, a method of disposing the V element powders onto the III element substrate includes the following steps. The V element powders and a first solvent are mixed to form a first mixture, and the mixture is homogenously implanted onto the III element substrate.

In an embodiment of the invention, a method of disposing the Si powders onto the III element layer of the carrier includes the following steps. The Si powders and a second solvent are mixed to form a second mixture, and the mixture is implanted onto the III element layer of the carrier.

In an embodiment of the invention, the step of heating the carrier to enable the Si powders and the III element layer of the carrier to form the p-type poly-Si layer is to heat the carrier to above 1400° C., so that the Si powders and the III element layer of the carrier form the p-type poly-Si layer.

In an embodiment of the invention, a method of providing the carrier includes the following steps. A III element substrate is provided. A V element is implanted into the III element substrate. The V element is activated to enable the V element and the III element substrate to form the carrier.

In an embodiment of the invention, a method of activating the V element includes utilizing an induction heating, an electromagnetic wave or an optical heating to activate the V element.

In an embodiment of the invention, after the p-type poly-Si layer is formed, the III-V compounds semiconductor layer may be removed, selectively.

In an embodiment of the invention, the method for fabrication the p-type semiconductor substrate may further include dividing the p-type poly-Si layer into a plurality of sub-p-type poly-Si layers.

In an embodiment of the invention, the method for fabricating the p-type semiconductor substrate may further include performing an annealing process to the sub-p-type poly-Si layers.

In an embodiment of the invention, the III-V compounds semiconductor layer includes a p-type aluminum phosphide layer, a p-type aluminum arsenide layer, or a p-type aluminum nitride layer, and the III element layer includes an aluminum element layer.

In an embodiment of the invention, a material of the n-type semiconductor layer includes n+-Si/O surperlattice.

In an embodiment of the invention, the method for fabricating the solar cell may further include the following steps. A transparent conducting electrode is formed on the n-type semiconductor layer, and the n-type semiconductor layer is disposed between the p-type poly-Si layer and the transparent conducting electrode.

In an embodiment of the invention, the method for fabricating the solar cell may further include following steps. A reflective film is formed on the p-type poly-Si layer. The p-type poly-Si layer is disposed between the reflective film and the n-type semiconductor layer.

In an embodiment of the invention, the solar cell may further include a transparent conducting electrode. The n-type semiconductor layer is disposed between the p-type poly-Si layer and the transparent conducting electrode.

In an embodiment of the invention, the solar cell may further include a reflective film. The p-type poly-Si layer is disposed between the reflective film and the n-type semiconductor layer.

According to the forgoing, in the fabricating processes of the p-type semiconductor substrate and the solar cell of an embodiment of the invention, the Si powders are disposed on the III element layer, and the carrier is heated to enable the Si powders and the III element layer to form the p-type poly-Si layer. Therefore, as compared to the conventional techniques, the fabricating processes of the p-type semiconductor substrate and the solar cell of an embodiment of the invention do not require to cut and grind off a large amount of polysilicon layers, such that a large amount of polysilicon materials may be reduced from being wasted, thereby significantly lowering the fabrication costs of the p-type semiconductor substrate and the solar cell.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
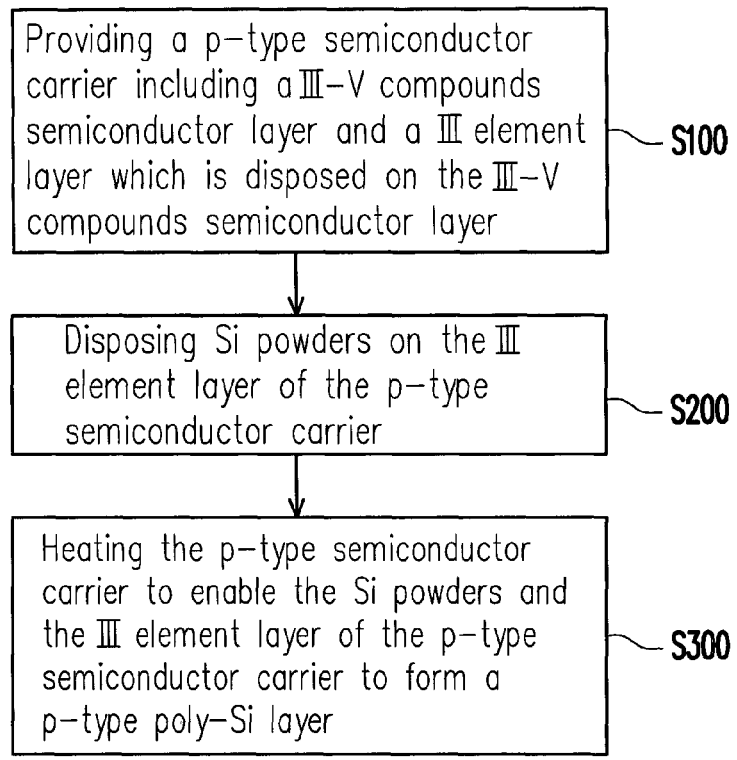
FIG. 1 is fabrication flow chart of a p-type semiconductor substrate according to an embodiment of the invention.

FIG. 1 is fabrication flow chart of a p-type semiconductor substrate according to an embodiment of the invention. Referring to FIG. 1, in the present embodiment, a method for fabricating a p-type semiconductor substrate includes the following steps. A carrier is provided, and the carrier includes a III-V compounds semiconductor layer and a III element layer disposed on the III-V compounds semiconductor layer (step S100). Si powders are disposed on the III element layer of the carrier (step S200). The carrier is heated to enable the Si powders and the III element layer of the carrier to form a p-type poly-Si layer (step 300). In the following, the fabricating process of the p-type semiconductor substrate according to an embodiment of the invention is described, accompanied with drawings, in detail below.

Figure 2:
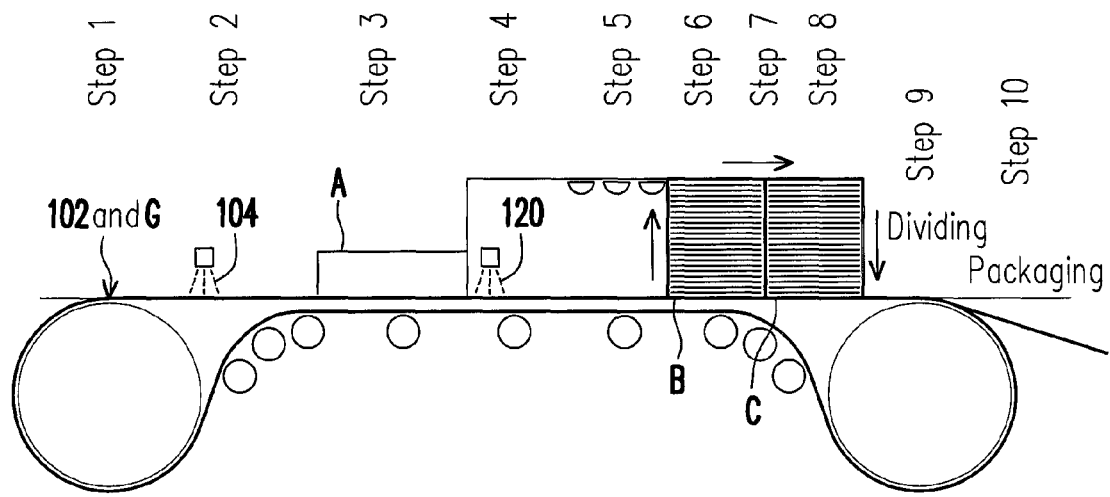
FIG. 2 is a schematic flow diagram illustrating the fabrication of a p-type semiconductor substrate according to an embodiment of the invention.

FIG. 2 is a schematic flow diagram illustrating the fabrication of a p-type semiconductor substrate according to the embodiment of the invention. FIG. 3A to FIG. 3F are schematic cross-sectional flow diagrams corresponding to the fabrication of the semiconductor substrate in FIG. 2. Referring to FIG. 2, firstly, a carrier 110 is provided. The carrier 110 includes a III-V compounds semiconductor layer (not indicted in FIG. 2) and a III element layer (not indicted in FIG. 2) disposed on the III-V compounds semiconductor layer. The III-V compounds semiconductor layer of the carrier 110 has a favorable heat tolerance, so that the carrier 110 may be a favorable carrier in the process of fabricating the p-type semiconductor substrate.

Figure 3A:
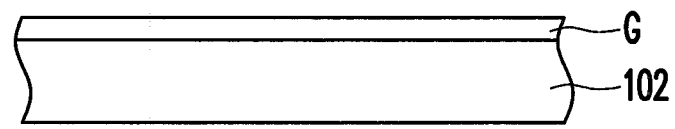
FIG. 3A to FIG. 3F are schematic cross-sectional flow diagrams corresponding to the fabrication of the semiconductor substrate in FIG. 2.
Figure 3B:
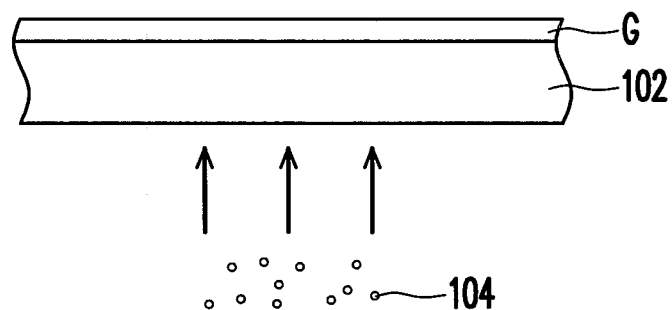
Figure 3C:
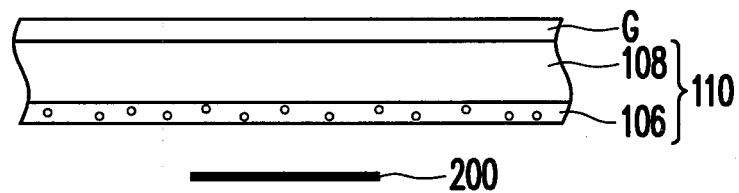

The following, in reference with FIG. 2 and FIG. 3A to FIG. 3C, a method of providing the carrier according to an embodiment of the invention is described in detail. Referring to step 1 of FIG. 2 and FIG. 3A, firstly, a III element substrate 102 is provided. Next, a graphite fiber belt G is formed on the III element substrate 102. Referring to step 2 of FIG. 2 and FIG. 3B, next, a V element 104 is implanted onto the III element substrate 102. Referring to step 3 of FIG. 2 and FIG. 3C, next, the V element 104 is activated to enable the V element 104 and the III element substrate 102 to form the carrier 110. In detail, as shown in FIG. 3C, after the V element 104 is activated, a portion of the III element substrate 102 and the V element 104 form a III-V compounds semiconductor layer 106 of the carrier 110, and another portion of the III element substrate 102 is namely the III element layer 108 disposed on the III-V compounds semiconductor layer 106. In the present embodiment, the III-V compounds semiconductor layer 106 is, for example, a p-type aluminum phosphide layer, a p-type aluminum arsenide layer or a p-type aluminum nitride layer, and the III element layer 108 is, for example, an aluminum element layer; but the invention is not limited thereto.

As shown by step 3 of FIG. 2 and FIG. 3C, in the present embodiment, the V element 104 may be activated via an induction heating. Specifically, the V element 104 may be activated by utilizing an induction heating coil 200. In the present embodiment, the V element 104 may be heated up to 300° C. in a chamber. Nevertheless, the invention is not limited thereto, in other embodiments, the V element 104 may be activated by utilizing an electromagnetic wave or an optical heating.

It is noted that, the method of providing a N/P carrier of the invention is not limited to those described in previous paragraphs (FIG. 2 and FIG. 3A to FIG. 3C), in other embodiments, other methods may also be adopted to provide the N/carrier. An example in compliance with FIG. 4A to FIG. 4D is illustrated in the following below.

Figure 4A:
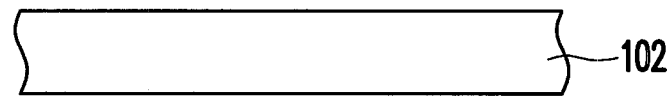
FIG. 4A to FIG. 4D illustrate a method of providing a carrier according to another embodiment of the invention.
Figure 4B:
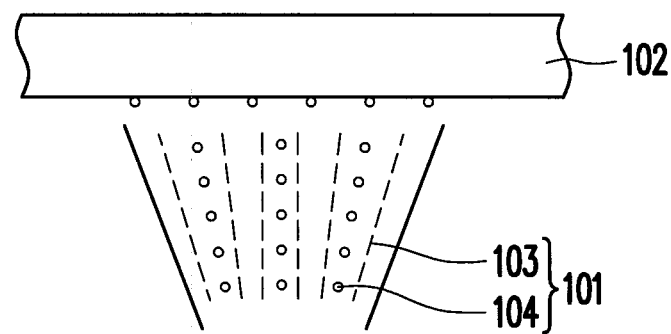

FIG. 4A to FIG. 4D illustrate a method of providing a carrier according to another embodiment of the invention. Referring FIG. 4A, firstly, the III element substrate 102 is provided. Referring to FIG. 4B, next, the V element powders 104 are disposed on the III element substrate 102. In detail, in the present embodiment, a method of disposing the V element powders 104 on the III element substrate 102 includes the following steps. Firstly, the V element powders 104 and a solvent 103 are mixed to form a mixture 101. Next, the mixture 101 is homogenously implanted onto the III element substrate 102. With this method, the V element powders 104 may be homogenously disposed on the III element substrate 102, and the solvent 103 implanted on the III element substrate 102 may be volatilized in the subsequent heating process.

Figure 4C:
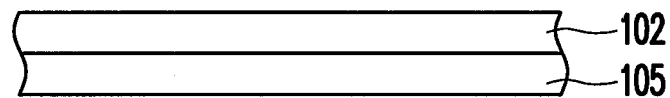
Figure 4D:
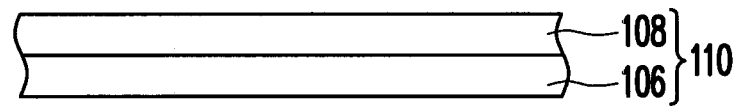

Referring to FIG. 4B and FIG. 4C, next, the III element substrate 102 is heated to enable a portion of the III element substrate 102 and the V element powders 104 to form a III-V compounds layer 105, wherein another portion 102a of the III element substrate 102 remains on the III-V compounds layer 105. Referring to FIG. 4C and FIG. 4D, then, the III element substrate 102 is heated to a melting point of the III element, so that a portion of the another portion 102a of the III element substrate 102 and the III-V compounds layer 105 form a III-V compounds semiconductor layer 106, wherein another portion 102b of the another portion 102a of the III element substrate is namely the III element layer 108. Herein, the carrier 110 may be provided.

Figure 3D:
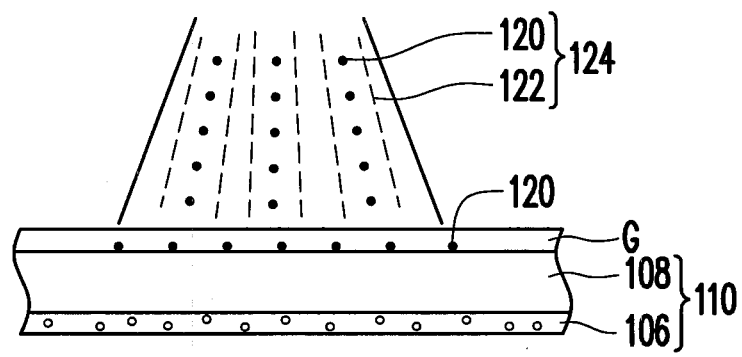

Referring to step 4 of FIG. 2 and FIG. 3D, after the carrier 110 is provided, next, the Si powders 120 are disposed on the III element layer 108 of the carrier 110. In detail, in the present embodiment, a method of disposing the Si powders 120 on the III element layer 108 includes the following steps. Firstly, the Si powders 120 and a solvent 122 are mixed into a mixture 124. Next, the mixture 124 is implanted onto the III element layer 108 of the carrier 110. With this method, the Si powders 120 may be homogenously disposed onto the III element layer 108, and thus the p-type semiconductor substrate with favorable quality is formed.

Figure 3E:
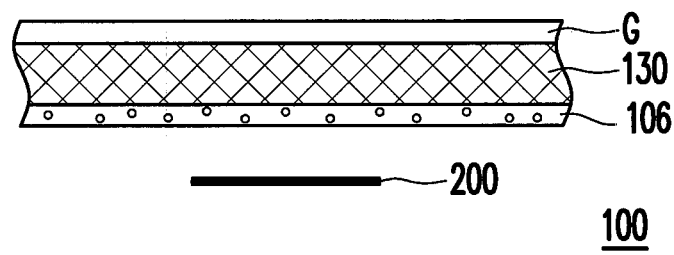

Referring to step 4 of FIG. 2 and FIG. 3E, next, the carrier 110 is heated to enable the Si powders 120 and the III element layer 108 to form the p-type poly-Si layer 130. Specifically, in the present embodiment, the step of heating the carrier 110 to enable the Si powders 120 and the III element layer 108 to form the p-type poly-Si layer 130 is to rapidly heat the carrier 110 to above 1430° C. (viz., reach and over the melting point 1.414° C. of the Si powders 102), so that the Si powders 120 and the III element layer 108 form the p-type poly-Si layer 130. At this point, the fabrication process of the p-type semiconductor substrate 100 of the present embodiment is initially completed. Noteworthily, as compared with the conventional techniques, the fabrication process p-type semiconductor substrate 100 of the present embodiment does not require to grind off a large amount of polysilicon layers, such that a waste of materials may be reduced, and thereby significantly lowering a fabrication cost of the p-type semiconductor substrate.

Referring to step 6 of FIG. 2 and FIG. 3E, a plurality of sub-p-type poly-Si layers 130a may be stacked in a 1350° C. chamber B filled with hydrogen ($H_2$) in order to perform an annealing process. Referring to steps 7 and 8 of FIG. 2, next, the sub-p-type poly-Si layers 130a in the chamber B may be moved into another chamber C for cooling (as illustrated by step 6 to step 7), next, the sub-p-type poly-Si layers 130a may sequentially be discharged from the chamber C (as illustrated by step 7 to step 8).

Figure 3F:
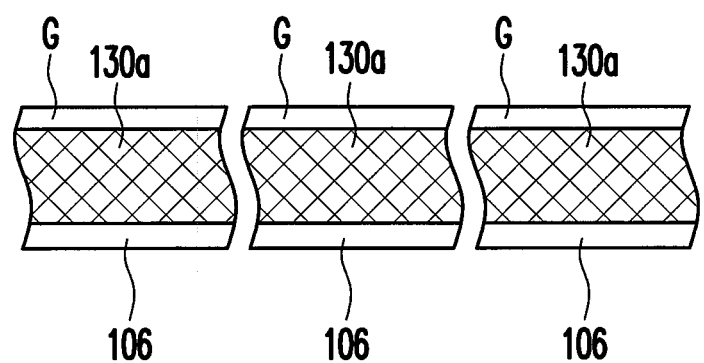

Referring to step 9 of FIG. 2 and FIG. 3F, a fabricator may divide the p-type poly-Si layer 130 into a plurality of sub-p-type poly-Si layers 130a according to an actual size of the solar cell in need. In the present embodiment, the p-type poly-Si layer 130 may be divided into a plurality of sub-p-type poly-Si layers 130a by utilizing a laser. The size of each sub-p-type poly-Si layers 130a is, for example, 5 cm multiplied by 5 cm. Referring to step 10 of FIG. 2, the divided sub-p-type poly-Si layers 130a, after being packaged, may be stored in pure nitrogen for transporting.

The p-type semiconductor substrate 100 of the present embodiment may further be fabricated into a solar cell. In detail, after the p-type poly-Si layer is completed, an n-type semiconductor layer may be formed on the p-type poly-Si layer, such that the solar cell is formed.

Figure 5A:
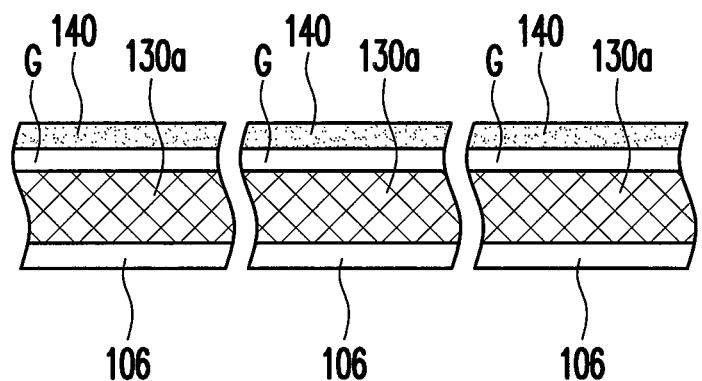
FIG. 5A to FIG. 5B illustrate the process of fabricating a p-type semiconductor substrate into a solar cell according to an embodiment of the invention.
Figure 5B:
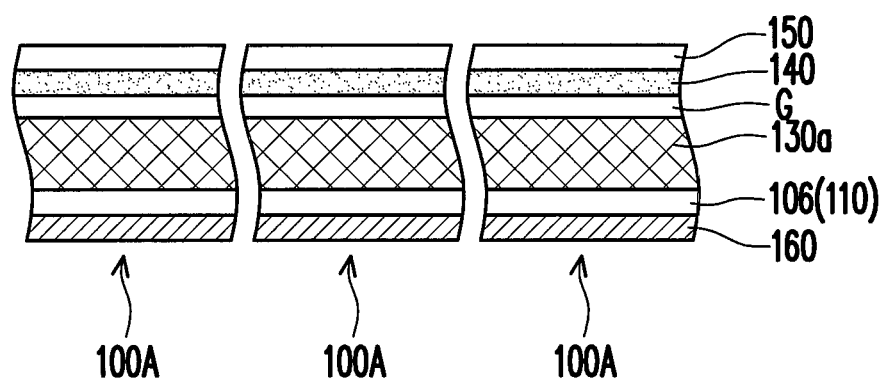

The following, accompanied with FIG. 5A to FIG. 5B, is described in detail below. FIG. 5A to FIG. 5B illustrate the process of fabricating a p-type semiconductor substrate into a solar cell according to an embodiment of the invention.

As shown in FIG. 3F, after the p-type poly-Si layer 130 is completed, in the present embodiment, the fabricator may divide the p-type poly-Si layer 130 into a plurality of sub-p-type poly-Si layers 130a according to the actual size of the solar cell in need.

Next, as shown in FIG. 5A, an annealing process may be performed to the sub-p-type poly-Si layers 130a. Then, a plurality of n-type semiconductor layers 140 may be respectively formed on the sub-p-type poly-Si layers 130a. A material of the n-type semiconductor layers 140 is, for example, n+-Si/O surperlattice or other suitable material. Noteworthily, n+-Si/O in a band of 1.8 eV or n+-AlSb in a band of over 2 eV may form a steep hetero junction barrier with the sub-p-type poly-Si layers 130 in a band of 1.1 eV. The steep hetero junction barrier may enable a solar cell with this barrier to have a reduced leakage, thereby increasing photoelectric conversion efficiency. In other words, the steep hetero junction barrier may enable the generating cost of the solar cell/watt to decrease significantly.

In the present embodiment, an atomic Layer Deposition (ALD) instrument may be utilized to perform the annealing process to the sub-p-type poly-Si layers 130a and to form the n-type semiconductor layers 140 on the sub-p-type poly-Si layers 130a. By utilizing the ALD instrument, the n-type semiconductor layers 140 may be rapidly formed on the sub-p-type poly-Si layers 130a in a large amount.

As shown in FIG. 5B, after the n-type semiconductor layers 140 are formed on the sub-p-type poly-Si layers 130a, a transparent conducting electrode 150 may be formed on each of the n-type semiconductor layers 140, selectively. The n-type semiconductor layer 140 is disposed between the sub-p-type poly-Si layer 130a and the transparent conducting electrode 150. Next, a reflective film 160 may be formed on the sub-p-type poly-Si layer 130a, selectively. The sub-p-type poly-Si layer 130a is disposed between the reflective film 160 and the n-type semiconductor layer 140. The reflective film 160 may increase transmission paths of incident light in the solar cell 100A, thereby enhancing a photoelectric conversion efficiency of the solar cell 100A.

FIG. 5B illustrates a solar cell according to an embodiment of the invention. The solar cell 100A of the present embodiment includes the carrier, the p-type poly-Si layer 130a and the n-type semiconductor layer 140. The carrier 110 includes the III-V compounds semiconductor layer 106. The sub-p-type poly-Si layers 130a is disposed on the III-V compounds semiconductor layer 106. The solar cell 100A of the present embodiment may further include the transparent conducting electrode 150. The n-type semiconductor layer 140 is disposed between the p-type poly-Si layer 130a and the transparent conducting electrode 150. The solar cell 100A of the present embodiment further include the reflective film 160. The p-type poly-Si layer 130a is disposed between the reflective film 160 and the n-type semiconductor layer 140. The solar cell 100A of the present embodiment has advantages of low fabrication cost and high photoelectric conversion efficiency.

In summary, in the fabrication processes of the p-type semiconductor substrate and the solar cell of the invention, the Si powders are disposed on the III element layer, and the carrier is heated to enable the Si powders and the III element layer to form the p-type poly-Si layer. Therefore, as compared to the conventional techniques, the fabrication processes of the p-type semiconductor substrate and the solar cell of the invention do not require to cut off and waste a large amount of polysilicon layers, such that a large amount of polysilicon materials may be reduced from being wasted, thereby significantly lowering the fabrication costs of the p-type semiconductor substrate and the solar cell.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for fabricating a p-type semiconductor substrate comprising:
   providing a carrier, the carrier comprising a III-V compounds semiconductor layer and a III element layer disposed on the III-V compounds semiconductor layer;
   disposing Si powders onto the III element layer of the carrier; and
   heating the carrier to enable the Si powders and the III element layer of the carrier to form a p-type poly-Si layer.

2. The method for fabricating of the p-type semiconductor substrate as claimed in claim 1, wherein a method of providing the carrier comprises the following steps:
   providing a III element substrate;
   disposing V element powders onto the III element substrate;
   heating the III element substrate to combine a first portion of the III element substrate and the V element powders to form a III-V compounds layer, wherein a second portion of the III element substrate remains on the III-V compounds layer; and
   heating the III element substrate to a melting point of the III element, so that a portion of the second portion of the III element substrate and the III-V compounds layer form the III-V compounds semiconductor layer, wherein another portion of the second portion of the III element substrate is the III element layer.

3. The method for fabricating of the p-type semiconductor substrate as claimed in claim 2, wherein a method of disposing the V element powders onto the III element substrate comprises the following steps:
   mixing the V element powders and a first solvent to form a first mixture; and
   homogeneously implanting the first mixture onto the III element substrate.

4. The method for fabricating of the p-type semiconductor substrate as claimed in claim 1, wherein a method of disposing the Si powders onto the III element layer of the carrier comprises the following steps:
   mixing the Si powders and a second solvent to form a second mixture; and
   implanting the second mixture onto the III element layer of the carrier.

5. The method for fabricating of the p-type semiconductor substrate as claimed in claim 1, wherein the step of heating the carrier to enable the Si powders and the III element layer of the carrier to form the p-type poly-Si layer is:
   heating the carrier to above 1400° C., so that the Si powders and the III element layer of the carrier form the p-type poly-Si layer.

6. The method for fabricating of the p-type semiconductor substrate as claimed in claim 1, wherein a method of providing the carrier comprises the following steps:
   providing a III element substrate;
   implanting a V element into the III element substrate; and
   activating the V element to enable the V element and the III element substrate to form the carrier.

7. The method for fabricating of the p-type semiconductor substrate as claimed in claim 6, wherein a method of activating the V element comprises:
   utilizing an induction heating, an electromagnetic wave or an optical heating to activate the V element.

8. The method for fabricating of the p-type semiconductor substrate as claimed in claim 7, wherein the V element and the III element substrate are entered into a nitrogen chamber when activating the V element.

9. The method for fabricating of the p-type semiconductor substrate as claimed in claim 1, further comprising:
   removing the III-V compounds semiconductor layer after the p-type poly-Si layer is formed.

10. The method for fabricating of the p-type semiconductor substrate as claimed in claim 9, wherein a method of removing the III-V compounds semiconductor layer comprises:
    enabling the III-V compounds semiconductor layer to react with water to form $(III)_2O_3$ and $H_3(V)$, wherein III represents the III element, and V represents the V element.

11. The method for fabricating of the p-type semiconductor substrate as claimed in claim 1, further comprising:
    dividing the p-type poly-Si layer into a plurality of sub-p-type poly-Si layers.

12. The method for fabricating of the p-type semiconductor substrate as claimed in claim 11, further comprising:
    performing an annealing process to the sub-p-type poly-Si layers.

13. The method for fabricating of the p-type semiconductor substrate as claimed in claim 1, wherein the III-V compounds semiconductor layer comprises a p-type aluminum phosphide layer, a p-type aluminum arsenide layer or a p-type aluminum nitride layer, and the III element layer comprises an aluminum element layer.

14. A method for fabricating a solar cell comprising:
    providing a carrier, the carrier comprising a III-V compounds semiconductor layer and a III element layer disposed on the III-V compounds semiconductor layer;

disposing Si powders onto the III element layer of the carrier;

heating the carrier to enable the Si powders and the III element layer of the carrier to form a p-type poly-Si layer; and forming an n-type semiconductor layer on the p-type poly-Si layer.

15. The method for fabricating the solar cell as claimed in claim 14, wherein a method of providing the carrier comprises the following steps:

providing a III element substrate;

disposing the V element powders onto the III element substrate;

heating the III element substrate to combine a first portion of the III element substrate and the V element powders to form a III-V compounds layer, wherein a second portion of the III element substrate remains on the III-V compounds layer; and heating the III element substrate to a melting point of the III element, so that a portion of the second portion of the III element substrate and the III-V compounds layer form the III-V compounds semiconductor layer, wherein another portion of the second portion of the III element substrate is the III element layer.

16. The method for fabricating the solar cell as claimed in claim 15, wherein a method of disposing the V element powders onto the III element substrate comprises the following steps;

mixing the V element powders and a first solvent to form a first mixture; and homogenously implanting the first mixture onto the III element substrate.

17. The method for fabricating the solar cell as claimed in claim 14, wherein the step of heating the carrier to enable the Si powders and the III element layer of the carrier to form the p-type poly-Si layer is:

heating the carrier to above 1400° C., so that the Si powders and the III element layer of the carrier form the p-type poly-Si layer.

18. The method for fabricating the solar cell as claimed in claim 14, wherein a method of disposing the Si powders onto the III element layer of the carrier comprises the following steps:

mixing the Si powders and a second solvent to form a second mixture; and implanting the second mixture onto the III element layer of the carrier.

19. The method for fabricating the solar cell as claimed in claim 14, wherein a method of providing the carrier comprises the following steps:

providing a III element substrate;

implanting a V element into the III element substrate; and activating the V element to enable the V element and the III element substrate to form the carrier.

20. The method for fabricating the solar cell as claimed in claim 14, wherein a method of activating the V element comprises:

utilizing an induction heating, an electromagnetic wave or an optical heating to activate the V element.

21. The method for fabricating the solar cell as claimed in claim 14, further comprising:

removing the III-V compounds semiconductor layer after the p-type poly-Si layer is formed.

22. The method for fabricating the solar cell as claimed in claim 14, further comprising: performing an annealing process to the p-type poly-Si layer.

23. The method for fabricating the solar cell as claimed in claim 14, wherein a material of the n-type semiconductor layer comprises $n^+$-Si/O surperlattice.

24. The method for fabricating the solar cell as claimed in claim 14, further comprising:

forming a transparent conducting electrode on the n-type semiconductor layer, and the n-type semiconductor layer being disposed between the p-type poly-Si layer and the transparent conducting electrode.

25. The method for fabricating the solar cell as claimed in claim 24, further comprising:

forming a reflective film on the p-type poly-Si layer, the p-type poly-Si layer being disposed between the reflective film and the n-type semiconductor layer.

* * * * *